United States Patent [19]

Serlovsky

[11] 4,030,717
[45] June 21, 1977

[54] ADJUSTABLE PRINTED CIRCUIT BOARD PALLET

[75] Inventor: Frank V. Serlovsky, Westchester, Ill.

[73] Assignee: D.N.S. Precision Machining, Cicero, Ill.

[22] Filed: Apr. 26, 1976

[21] Appl. No.: 680,242

[52] U.S. Cl. .................................. 269/118; 228/37; 269/321 WE

[51] Int. Cl.² ........................ B25B 5/02; B25B 5/14

[58] Field of Search ................ 228/180, 36, 37, 40, 228/51; 269/321 WE, 55, 56, 111, 118, 119, 120, 121, 203, 287

[56] References Cited

UNITED STATES PATENTS

| 3,565,319 | 2/1971 | Eschenbrucher | 228/37 |
| 3,930,644 | 1/1976 | Albert | 269/321 WE |

Primary Examiner—Al Lawrence Smith
Assistant Examiner—Robert C. Watson
Attorney, Agent, or Firm—Bernard L. Kleinke

[57] ABSTRACT

A pallet for holding a printed circuit board on a conveyor in a solder wave machine which applies molten solder to the underside of the printed circuit board for completing connections, includes a pair of longitudinally extending first and second bars mounted on a frame, the bars including a pair of oppositely disposed longitudinally-extending grooves for receiving the opposite side marginal edges of the printed circuit board. Each one of the grooves is substantially channel-shaped and extends to the rear end portion of the bars so that the printed circuit board may be slipped into the grooves at the rear end portion of the bars to insert the board in position. One of the bars is transversely movable relative to the frame, and the other bar is fixed in position on the frame, the movable bar being fixed releasably to the first bar in an adjusted position to the frame for accommodating various different sizes of boards. A transversely extending third bar mounted on the front portion of the frame includes a lengthwise extending groove for receiving an end marginal edge of the printed circuit board. The lower edge of the transversely disposed bar extends below the underside of the printed circuit board to cut into and spread out the wave of molten solder produced by the solder wave applying machine for distributing it over the underside of the printed circuit board.

6 Claims, 5 Drawing Figures

U.S. Patent            June 21, 1977            4,030,717
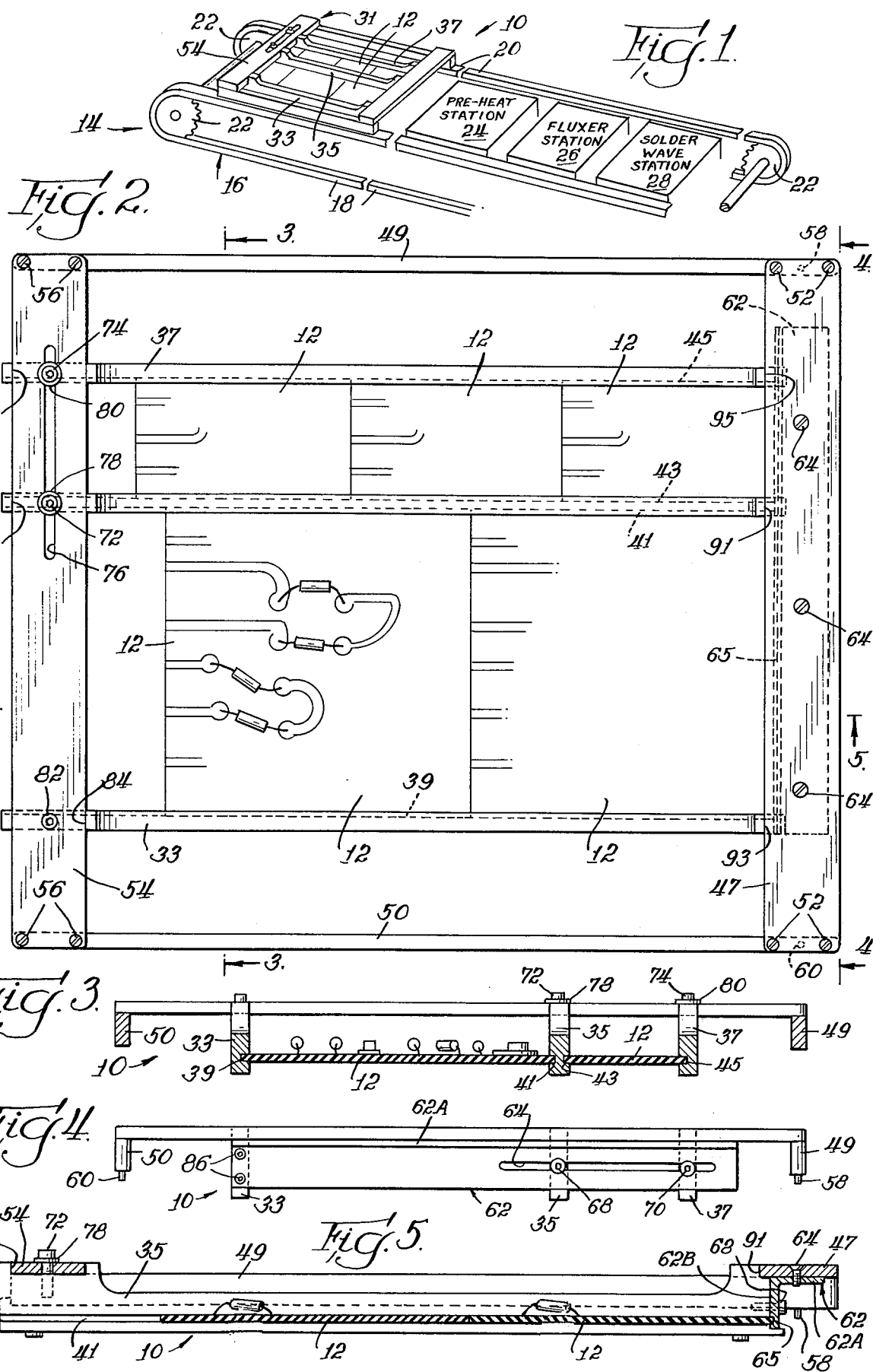

ADJUSTABLE PRINTED CIRCUIT BOARD PALLET

The present invention relates to an adjustable printed circuit board pallet, and it more particularly relates to a pallet for holding printed circuit boards being conveyed through a solder wave machine, the pallet being adjustable to accommodate various different sizes of printed circuit boards.

Pallets have been used for holding printed circuit boards in connection with solder wave machines, which are used to solder components onto the printed circuit boards. One type of solder wave machine includes a pair of spaced-apart conveyor chains for carrying the pallet which in turn carries a printed circuit board to be soldered past a series of three stations. The first two stations pre-heat the underside of the board and apply flux for cleaning the connections. A third station is the solder wave station which applies molten solder to the ends of the components extending through holes in the printed circuit board for soldering the connections to the conductors on the board. The solder wave station includes a pump to serve as a fountain to flow molten solder upwardly which then falls downwardly under the force of gravity so that the circuit board can be passed through the apex of the molten solder, which in turn then flows onto the underside of the printed circuit board. The molten solder is pumped upwardly in a recirculating manner, and after the conveyor moves the pallet past the last station, the pallet is then removed from the conveyor so that the completed printed circuit board may be removed from the pallet. For examples of such solder applying machines, reference may be made to the following U.S. Pat. Nos.: 3,056,370; 3,482,755; 3,605,244 and 3,921,888.

While such custom made pallets may be acceptable for some applications, it would be highly desirable to have an adjustable pallet which accommodates various different sizes of printed circuit boards. Attempts have been made to make the printed circuit board pallet adjustable by using spring loaded clamps to hold the printed circuit boards in position, but they have not been entirely satisfactory for some applications, since they have not held securely the printed circuit boards in position and were not convenient to use. In this regard, the circuit components are slipped into the holes in the printed circuit board and merely rest in position while the pallet is transported through the solder applying machine, whereby any jarring or vibration caused by the movement of the molten solder against the underside of the printed circuit board may dislodge the circuit components or otherwise cause improper or unsatisfactory connections to be made. Thus, it would be highly desirable to have a new and improved adjustable pallet which can accommodate various different sizes of printed circuit boards and which holds the printed circuit boards securely during the solder applying operation. Also, such a new and improved pallet should help apply the molten solder to the underside of the board in an evenly distributed manner.

Therefore, the principal object of the present invention is to provide a new and improved adjustable printed circuit board pallet, which may accommodate various different sizes of printed circuit boards, and which holds the printed circuit boards in a secure manner during the applying of molten solder to the underside of the board.

Another object of the present invention is to provide such a new and improved adjustable printed circuit board pallet which helps to evenly distribute the molten solder flowing to the underside of the printed circuit board.

Briefly, the above and further objects of the present invention are realized by providing an adjustable printed circuit board pallet, which includes a pair of longitudinally extending first and second bars mounted on a frame, the bars including a pair of oppositely disposed longitudinally-extending grooves for receiving the opposite side marginal edges of the printed circuit board. Each one of the grooves is substantially channel-shaped and extends to the rear end portion of the bars so that the printed circuit board may be slipped into the grooves at the rear end portions of the bars to insert the board in position. One of the bars is fixed to the frame, and the other bar is mounted in a transversely movable manner, a device being provided for fixing releasably the movable bar in an adjusted position to the frame for accommodating various different sizes of boards. A transversely extending third bar mounted on the front portion of the frame includes a lengthwise extending groove for receiving an end marginal edge of the printed circuit board to provide for even greater stability in the manner in which the board is held in position. The lower edge of the transversely disposed bar extends below the underside of the printed circuit board to cut into and spread out the wave of molten solder for distributing it over the underside of the printed circuit board.

The invention, both as to its organization and method of operation, together with further objects and advantages thereof, will best be understood by reference to the following detailed description taken in connection with the accompanying sheet of drawings, wherein:

FIG. 1 is a fragmentary schematic drawing of a solder wave machine and an adjustable printed circuit board pallet which is mounted thereon and which incorporates the principles of the present invention;

FIG. 2 is a greatly enlarged plan view of the pallet of FIG. 1;

FIG. 3 is a cross-sectional view of the pallet of FIG. 2 taken substantially along the line 3—3 thereof;

FIG. 4 is a cross-sectional view of the pallet of FIG. 2 taken substantially along the line 4—4 thereof; and FIG. 5 is a cross-sectional view of the pallet of FIG. 2 taken substantially along the line 5—5 thereof.

Referring now to the drawings, and more particularly to FIG. 1 thereof, there is shown an adjustable printed circuit board pallet 10, which is constructed in accordance with the present invention to hold printed circit boards 12, and which supports them while they are conveyed through a solder wave machine 14. The solder wave machine 14 generally comprises a conveyor 16 which includes a pair of parallel spaced-apart chains 18 and 20 for supporting the pallet 10 therebetween. Sprockets 22 are driven by a source of power (not shown) to move the pair of chains for transporting the printed circuit board carrying pallet 10 past a series of stations disposed between the chains 18 and 20. A pre-heat station 24 and a fluxer station 26 heat the underside of the printed circuit boards 12 and apply flux for cleaning the circuit component connections. A solder wave station 28 supplies molten solder to the underside of the pre-heated and cleaned printed circuit boards 12 which have circuit components to be soldered thereto. The solder wave station 28 may include a fountain (not shown) for spraying molten solder upwardly into the path of travel of the pallet 10 so that circuit component leads extending through holes in the printed circuit boards 12 may be soldered to conductors on the printed circuit boards. It should be understood that the adjustable printed circuit board pallet 10 of the present invention may be used with different types and kinds of solder wave machines. For example, the pallet of the present invention is adapted to be used with machines employing different types and kinds of conveyors.

The adjustable pallet 10 generally comprises a rectangular frame 31 having a fixed longitudinally extending bar 33 and a pair of movable longitudinally extending bars 35 and 37 which are adjustably fixed in position to accommodate various different sizes of printed circuit boards as hereinafter described in greater detail. As shown in FIGS. 2, 3 and 5 of the drawings, the fixed bar 33 has a longitudinally extending groove 39 extending throughout its length for receiving side marginal edges of the printed circuit boards 12, and similarly the intermediate movable longitudinally extending bar 35 has a longitudinally extending groove 41 extending throughout its length for receiving the opposite side marginal edges of printed circuit boards 12, the grooves 33 and 35 being arranged in the same plane in opposite confronting relationship relative to one another. Similarly, a groove 43 extending throughout the length of the movable intermediate bar 35 receives the side marginal edges of printed circuit boards 12 so that printed circuit boards 12 may extend from opposite sides of the intermediate movable bar 35 in a common plane, and a groove 45 in the other movable bar 37 extends throughout the length of the bar 37 for receiving the opposite side marginal edges of the printed circuit boards 12, the grooves 43 and 45 being disposed in confronting relationship in a common plane with the grooves 39 and 41 to support the printed circuit boards on both sides of the intermediate bar 35 in a common plane. As hereinafter described in greater detail, the movable bars 35 and 37 may be positionally adjusted relative to the fixed longitudinal bar 33 to accommodate various different widths of printed circuit boards. The printed circuit boards are slipped into the pairs of grooves and arranged in abutting relationship so that the pallet 10 can accommodate various different lengths of printed circuit boards or a series of shorter printed circuit boards positioned in abutting end-to-end relationship as illustrated in the drawings.

Considering now the frame 31 in greater detail with reference to FIGS. 2, 3, 4 and 5 of the drawings, the frame 31 includes a front frame member 47 fixed to the top edges of the front portions of a pair of oppositely-disposed parallel spaced-apart longitudinally extending side frame members 49 and 50 by means of screws 52. A rear frame member 54 is secured by screws 56 to the top edge of the rear portions of the side frame members 49 and 50 to cause the frame 31 to have a rectangular shape. A pair of downwardly depending pins 58 and 60 extend from the underside of the front portions of the side frame members 49 and 50 to engage the corresponding chains 20 and 18 of the conveyor 16 so that the conveyor 16 can pull the pallet 10 over the stations of the solder wave machine 14 of FIG. 1.

In accordance with the present invention, for the purpose of facilitating the distribution of the molten solder to the underside of the printed circuit boards 12, as best seen in FIGS. 2, 4 and 5 of the drawings, an angle iron bar 62 has a horizontal portion 62A which is fixed to the underside of the front transversely extending frame member 47 by means of a series of screws 64. A groove 65 in a vertical portion 62B of the angle iron bar 62 receives the front end portions of the printed circuit boards 12 for greater stability in holding them in position. The groove 65 is in the same common plane with the grooves in the longitudinally-extending bars. The groove 65 is disposed near the bottom edge of the vertical portion 62B of the bar 62 so that the bottom edge of the vertical portion 62B serves as a plow to cut into and spread out the wave of molten solder for distributing it over the underside of the printed circuit boards 12. Thus, the bar 62 serves the dual purpose of more firmly securing the printed circuit boards 12 in position on the pallet 10 and of distributing the molten solder to the underside of the printed circuit boards.

In order to make the longitudinal bars 35 and 37 to be movable, an elongated slot 66 (FIG. 4) in the vertical portion 62A of the front bar 62 extends transversely to receive a pair of set screws 68 and 70 fastened into the front end edges of the respective longitudinal bars 35 and 37. As shown in FIGS. 2 and 3 of the drawings, a pair of cap screws 72 and 74 extend through an elongated slot 76 in the rear frame member 54 and are tightened into tapped holes in the upper edges of the rear portions of the movable longitudinal bars 35 and 37, washers 78 and 80 being disposed between the rear frame member 54 and the respective heads of the screws 72 and 74.

A screw 82 extends through the rear frame member 54 and is tightened into a tapped hole in the top edge of the rear portion of the fixed longitudinally-extending bar 33 to fix it in place within a recess 84 in the rear portion of the bar 33 to make the frame member 54 flush with the rear portion of the bar 33. Screws 86 extend through holes in the angle iron bar 62 into tapped holes in the front end edge of the fixed bar 33 to secure it in place. A complementary-shaped recess 88 in the upper edge of the rear portion of the intermediate movable bar 35 receives the rear frame member 54 at the elongated slot 76 to make the rear frame member 54 flush with the rear end portion of the intermediate movable bar 35. Similarly, a complementary-shaped recess 89 in the top edge of the rear portion of the other movable bar 37 makes the rear frame member 54 flush with the rear portion of the movable bar 37. As best seen in FIGS. 2 and 5 of the drawings, a complementary-shaped recess 91 in the upper front end portion of the intermediate bar 35 receives the front frame member 47 to make it flush therewith. Similarly, front recesses 93 and 95 in the top edge portions of the front end portions of the bars 93 and 95 enable the front frame member 47 to be flush therewith.

In order to prevent any relative rotation between the movable bars 35 and 37 and the angle bar 62, a pair of forwardly extending lips or flanges 97 and 99 project forwardly from the front end portions of the movable bars 35 and 37 to fit under the vertical portion 62A of the angle bar 62. As a result, the movable bars 35 and 37 are fixed securely in place by the screws 68 and 70. It will become apparent to those skilled in the art that instead of employing the lips 97 and 99, a second elongated slot (not shown) similar to the slot 64, may extend through the vertical portion 62A of the angle iron 62 for receiving a second pair of screws (not shown).

It should be understood that the intermediate longitudinally-extending bar 35, if desired, may be removed from the pallet 10 to accommodate certan sizes of printed circuit boards. For example, printed circuit boards (not shown) of a greater width than the printed circuit boards 12 shown in the drawings could be held in place between the fixed longitudinally-extending bar 33 and the movable bar 37, whereby the intermediate longitudinally-extending bar 35 would be removed from the pallet 10 by removing the screws 72 and 68.

All of the parts of the pallet 10 may be composed of a rigid material, such as metal. The pallet 10 may, for example, be composed of aluminum, and the entire pallet 10, except for the screws and washers, should be impregnated with Teflon for facilitating removal of solder from the pallet 10. The pallet of the present invention may alternatively be composed of stainless steel or titanium, which do not require impregnation with Teflon since these materials are readily cleanable.

The grooves for receiving the side edges of the printed ciruit boards are complementary shaped relative to the shape of the printed circuit boards and are thus channel shaped. As shown in FIG. 3 of the drawings, the movable longitudinally-extending bars are positioned such that the side edges of the printed circuit boards do not completely enter all of the way into the grooves to provide clearance spaces so that when the boards are heated they can expand without buckling. The adjustments made to the longitudinally-extending movable bars 35 and 37 can be made by unskilled personnel.

While the present invention has been described in connection with a particular embodiment thereof, it will be understood that many changes and modifications of this invention may be made by those skilled in the art without departing from the true spirit and scope thereof. Accordingly, the appended claims are intended to cover all such changes and modifications as fall within the true spirit and scope of the present invention.

What is claimed is:

1. A pallet for holding printed circuit boards on conveying means in a solder wave machine, said machine flowing molten solder in a wave to solder connections on the underside of the board, said pallet comprising:
    a frame;
    a pair of longitudinally-extending first and second bars mounted on said frame;
    attaching means for mounting said frame to said conveying means;
    means defining a pair of oppositely disposed longitudinally-extending grooves in said bars for receiving the opposite side marginal edges of printed circuit boards;
    a transversely disposed plow bar mounted on the front portion of said frame; and
    means defining a lengthwise extending groove in said transversely disposed plow bar in a common plane with said longitudinally-extending grooves for receiving end marginal edges of printed circuit boards, the lower edge of said plow bar extending below said plane so that the undersides of printed circuit boards cut into and spread out the wave of molten solder for distributing it over the underside of printed circuit boards mounted on said pallet.

2. A pallet according to claim 1, wherein an elongated slot is disposed in said plow bar, a fastening member extending through said slot to fix releasably said first longitudinally-extending bar to said plow bar, the rear end portion of said first bar being fixed releasably to the rear portion of said frame.

3. A pallet according to claim 2, wherein said rear end portion of said frame includes an elongated slot, fastening means extending through the last mentioned slot to fix releasably the rear end portion of said first longitudinally-extending bar.

4. A pallet according to claim 2, further including an intermediate longitudinally-extending bar mounted on said frame having a pair of longitudinally-extending grooves on opposite sides thereof for receiving side marginal edges of printed circuit boards extending transversely from said opposite sides of said intermediate longitudinally-extending bar between said intermediate transversely extending bar and said first and second longitudinally-extending bars, means for fixing releasably said intermediate bar releasably in an adjusted position to said frame.

5. A pallet according to claim 4, wherein said attaching means includes a pair of pins.

6. A pallet for holding printed circuit boards on conveying means in solder applying machines, comprising:
    a frame;
    a pair of longitudinally-extending first and second bars mounted on said frame;
    attaching means for mounting said frame to said conveying means;
    means defining a pair of oppositely disposed longitudinally-extending grooves in said bars for receiving the opposite side marginal edges of printed circuit boards, each one of said grooves being substantially channel-shaped and extending to the rear end portion of said bars so that printed circuit boards may be slipped into said grooves at the rear end portions of said bars to insert the boards in position;
    means for mounting transversely movably said first bar on said frame;
    means for fixing said second bar to said frame; and
    means for fixing releasably said first bar in an adjusted position to said frame for accommodating various different sizes of printed circuit boards, further including a transversely disposed plow bar mounted on the front portion of said frame, means defining a lengthwise extending groove in said plow bar in a common plane with the longitudinally-extending grooves for receiving end marginal edges of printed circuit boards.

* * * * *